United States Patent [19]

Millham

[11] Patent Number: 4,682,330
[45] Date of Patent: Jul. 21, 1987

[54] HIERARCHICAL TEST SYSTEM ARCHITECTURE

[75] Inventor: Ernest H. Millham, Catlett, Va.

[73] Assignee: International Business Machines Corporation, Armonk, N.Y.

[21] Appl. No.: 786,428

[22] Filed: Oct. 11, 1985

[51] Int. Cl.[4] .................. G06F 11/00; G01R 31/28
[52] U.S. Cl. .................................. 371/20; 371/27; 324/73 R
[58] Field of Search ............ 371/15, 20, 24, 25, 371/27; 324/73 R

[56] References Cited

U.S. PATENT DOCUMENTS

| | | |
|---|---|---|
| 3,787,669 | 1/1974 | Muehldorf . |
| 3,873,818 | 3/1975 | Barnard . |
| 4,044,244 | 8/1977 | Foreman et al. . |
| 4,070,565 | 6/1978 | Borrelli . |
| 4,168,527 | 9/1979 | Winkler . |
| 4,283,620 | 8/1981 | Drescher et al. . |
| 4,402,081 | 8/1983 | Ichimiya et al. . |
| 4,493,079 | 1/1985 | Hughes ............... 371/20 X |
| 4,598,245 | 7/1986 | Groves ............... 371/27 X |

OTHER PUBLICATIONS

J. P. Bansal, "Simultaneous Compare of Multi-Test Pattern Results During LSI/VLSI Component Testing", vol. 26, No. 2, Jul. 1983, p. 744.

Primary Examiner—Jerry Smith
Assistant Examiner—Robert W. Beausoliel, Jr.
Attorney, Agent, or Firm—John E. Hoel

[57] ABSTRACT

A hierarchical complex logic tester architecture is disclosed which minimizes the encoding of program information for testing. The architecture takes advantage of the fact that much of the information applied as test signals to pins of a device under test, changes little from test cycle to test cycle. In one aspect of the invention, run length encoding techniques are used for identifying the number of test cycles over which a given test pin is to be maintained in a particular signal state. In another aspect of the invention, use is made of a small memory associated with each signal pin of the device to be tested. There may be a small plurality of for example, 16 different kinds of signals which can be applied to or received from a given signal pin of a device under test. The dedicated small memory associated with each device pin to be tested, will have the ability to store from one to 16 states. The current states stored in a dedicated-per-pin memory will enable one of the 16 different types of test signals per test cycle to be applied to the particular device pin. Thus, the types of signal driving or sensing for each of the plurality of pins for a device under test, need only be indicated once to the per-pin-memory over a large plurality of test cycles. This enables consecutive test cycles to be applied to the device under test under the control of a relatively small number of tester program words.

4 Claims, 4 Drawing Figures

PRIOR ART TESTER

HIERARCHICAL TEST SEQUENCER

HIERARCHICAL
TEST SYSTEM

SIMPLE LSSD TEST DATA

EXAMPLE
1-S/R STRING
3-LATCHES/STRING
2-LSSD PATTERNS
2-PI/PO
2-PI/PO CYCLES/PATTERN ial Field

HIERARCHICAL TEST SYSTEM ARCHITECTURE

BACKGROUND OF THE INVENTION

1. Technical Field

The invention disclosed broadly relates to electrical testing and more particularly relates to testing complex logical devices.

2. Background Art

Prior art tester architectures, such as that shown in FIG. 1, employ a main processor 10 to exercise primary control over the test system and establish the test sequence and parameters according to an operational test program. Each pin, pin 1, pin 2, pin 3 . . . to pin N of a device under test 20 in FIG. 1, has its own corresponding pin electronics circuit including a decoder 16(1), 16(2), 16(3) to 16(N), and a driver/sensor 18(1), 18(2), 18(3), to 18(N), respectively. Where a device under test 20 has N pins, N pin electronic circuits, each including a decoder and a driver/sensor, are required, as is shown in FIG. 1.

A high speed local memory 14 has a data input connected to the main processor 10 and the bulk store 12 for receiving and storing a plurality of test vectors 15A to 15D, etc. Each test vector includes a plurality of N test words. For example, the test vector 15A includes the test words 15A(1), 15A(2), 15A(3), to 15A(N). A test vector can also include an instruction portion, for example the test vector 15A can include the instruction portion 15AI. During each testing cycle, the local memory 14 sequentially outputs the test words from a test vector. For example, the test word 15A(1) would be output to the decoder 16(1) and the test word 15A(2) would be output to the decoder 16(2), etc. for the vector 15A. The decoder 16(1) decodes the test word and applies a decoded output to the driver/sensor 18(1). Each driver/sensor 18(1) to 18(N) is controlled by its corresponding decoder 16(1) through 16(N) to provide any one of at least the following circuit functions: driver, detector, load, power supply, ground, open circuit, etc. The test function performed by a driver/sensor is determined by the test word output from the local memory 14 to the corresponding decoder connected to the driver/sensor. In response to the application of the testing function generated by a driver/sensor in FIG. 1, the corresponding pin of the device under test 20 will be subjected to an electrical manifestation or the absence of an electrical manifestation, in accordance with its function. For example, logical input pins of the device 20 will receive an electrical signal representing a binary one or a binary zero value as called for by the test program, power supply pins for the device under test will receive a voltage forcing or current forcing electrical value as called for by the test program, the load pins of the device 20 will be subjected to an appropriate electrical load as called for by the test program, the output pins will be conditioned to receive an output from the device under test 20 as directed by the test program, etc. Each driver/sensor 18(1) to 18(N), is connected by a feedback line 19 to the main processor 10 to indicate the pass/fail condition of the device under test 20, for analysis of any failures which may be detected.

Some prior art testers will include the provision for storing an instruction or a test pattern field 15AI for a test vector 15A in FIG. 1, to enable feeding back over line 17 information to the main processor 10 operating instructions for control of local memory 14 to enable data control such as branching, looping, etc.

A significant problem with prior art tester architecture such as that shown in FIG. 1 is the large memory size for the local memory 14 and the bulk store 12, which is required to accommodate the testing of a device under test 20 having a plurality N of pins greater than 100. With the advent of very large scale integrated circuits, the number of test cycles necessary to adequately test the highly complex logic on the device, coupled with the large number of pins for the device, creates a requirement for multi megabyte memory sizes for the local memory 14 in order to accommodate the test vectors.

One approach to solving this problem of large memory size requirements is the use of algorithmic pattern generators in the prior art. Algorithmic pattern generators of various types have been extensively used where test data is of a highly repetitive nature such as in memory testing. However, such pattern generators have a disadvantage of requiring high speed multiplexers in the signal paths or they require fixed (hardwired) connections to specific pins and are relatively expensive and inflexible and are not applicable to random logic.

Alternately, smaller tester memories can be used for storing fewer test vectors than are required for a complete test, and then the relatively small local memory can be sequentially loaded with test vectors for consecutive stages of testing. However, this reduces the overall throughput for testing since additional time is required to reload the local memory.

OBJECTS OF THE INVENTION

It is therefore an object of the invention to provide an improved test system architecture.

It is another object of the invention to provide an improved test system architecture which eliminates the need for very large memories.

It is another object of the invention to provide an improved test system architecture which eliminates the need for test pattern generators.

It is still another object of the invention to provide an improved test system architecture which eliminates the need for cyclic decision logic.

It is yet a further object of the invention to provide an improved test system architecture which has relatively low memory requirements and yet does not decrease the overall throughput for testing operations.

DISCLOSURE OF THE INVENTION

These and other objects, features and advantages of the invention are accomplished by the hierarchical tester architecture disclosed herein. The invention finds application in a stored program complex logic tester, including a test cycle clock for controlling the sequence of test cycle intervals, and a tester interface having a plurality of N contacts which operatively connect respective terminals of a device under test to a respective one of a plurality of N driver/sensor pairs, each driver/sensor pair having a digital control input. The hierarchical test sequencer, includes a change control memory having an address input, a plurality of N control bit outputs and a count value output, for storing a plurality of M cluster words, each j-th one of the M cluster words including a plurality of N change control bits $b(i,j)$ and a count value $C(j)$, (where i is an integer from 1 to N and j is an integer from 1 to M).

The hierarchical test sequencer also includes a first address generating means having a first input connected to the count value output and a second input connected to the test cycle clock, for synchronously changing the address applied to the address input of the change control memory in response to the count value output, to access the cluster words therein.

The hierarchical test sequencer also includes a plurality of N pin address memories, each corresponding to a respective i-th one of the N change control bit outputs and each having an address input and a data output, for storing a second plurality of instruction address values in an i-th one of the N pin address memories, the second plurality being the sum of the products of the count value C(j) times the change control bit b(i,j), for all values of j from from 1 to M.

The hierarchical test sequencer also includes a plurality of N second address generating means, each having an input connected to a respective i-th one of the N control bit outputs and an input connected to the test cycle clock, and an output connected to the address input of a respective i-th one of the N pin address memories, for changing the address input to the respective i-th pin address memory in response to a first binary value of the i-th change control bit b(i,j) output by the change control memory.

The hierarchical test sequencer also includes a plurality of N pin control memories, each having an address input connected to the output of a respective i-th one of the N pin address memories, and a data output connected to decode circuits i through N respectively whose output is connected to the digital control input of a respective i-th one of the N driver/sensor pairs. The pin control memories are used for storing a plurality of pin function instructions accessible by the instruction address values, each instruction controlling the test function of the respective driver/sensor pair during one of the test cycle intervals. In this manner, an improved complex logic tester is formed.

BRIEF DESCRIPTION OF THE DRAWINGS

The foregoing and other advantages of the invention will be more fully understood with reference to the description of the best mode and the drawing wherein.

DESCRIPTION OF THE BEST MODE FOR CARRYING OUT THE INVENTION

Figure 1:
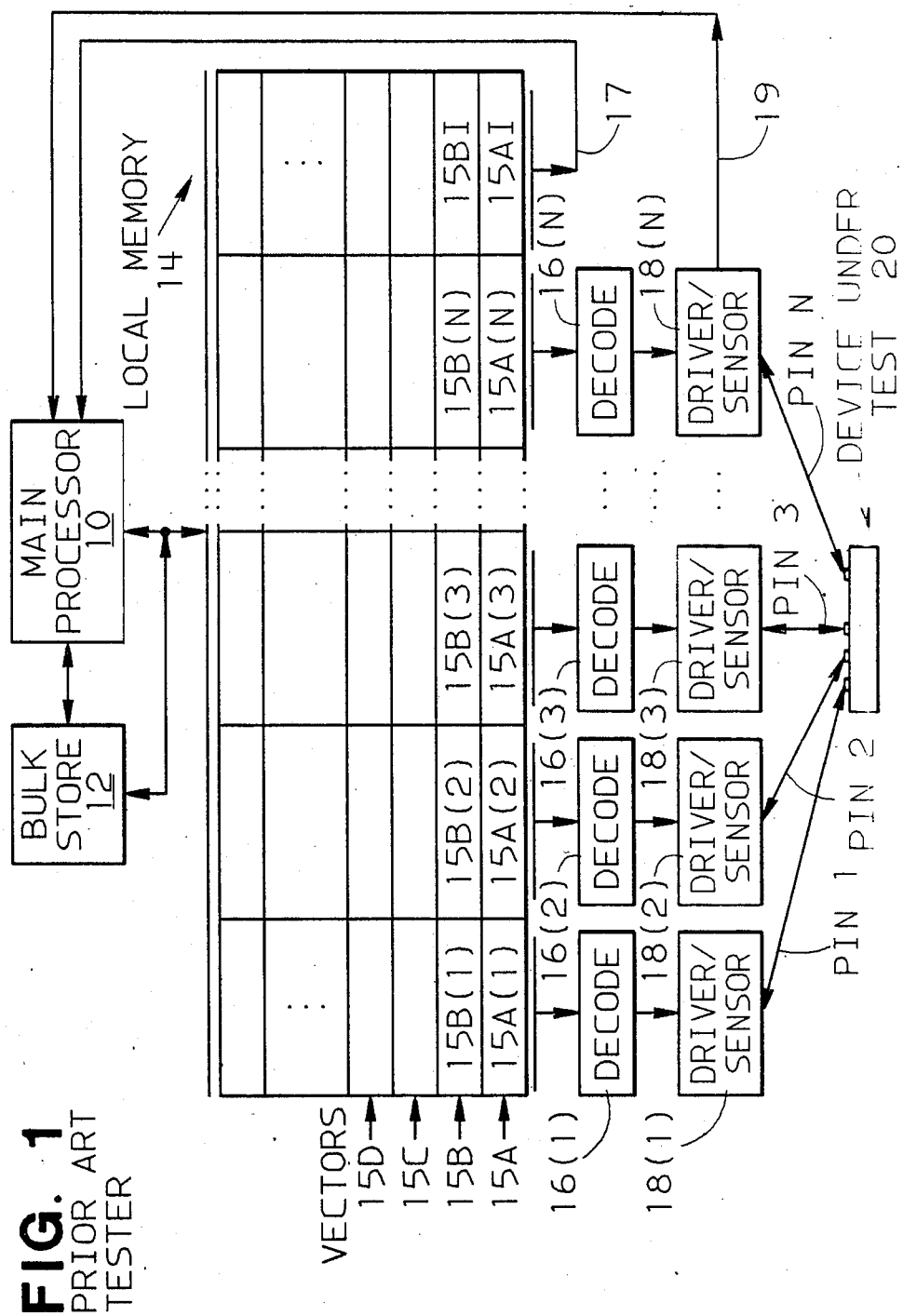
FIG. 1 is a system block diagram of a prior art testing architecture.
Figures 2, 2A:
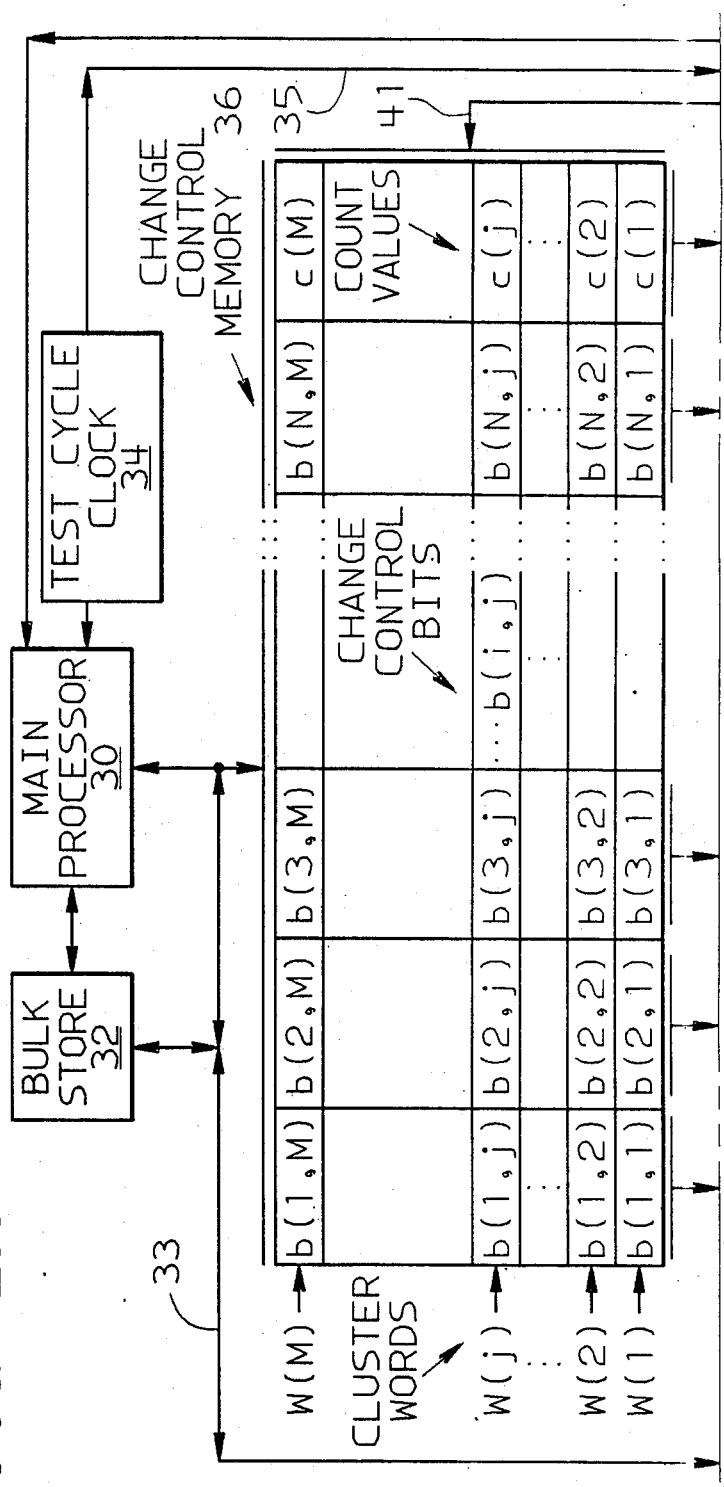
FIG. 2 is a system block diagram of the hierarchical tester architecture invention.
Figure 2B:
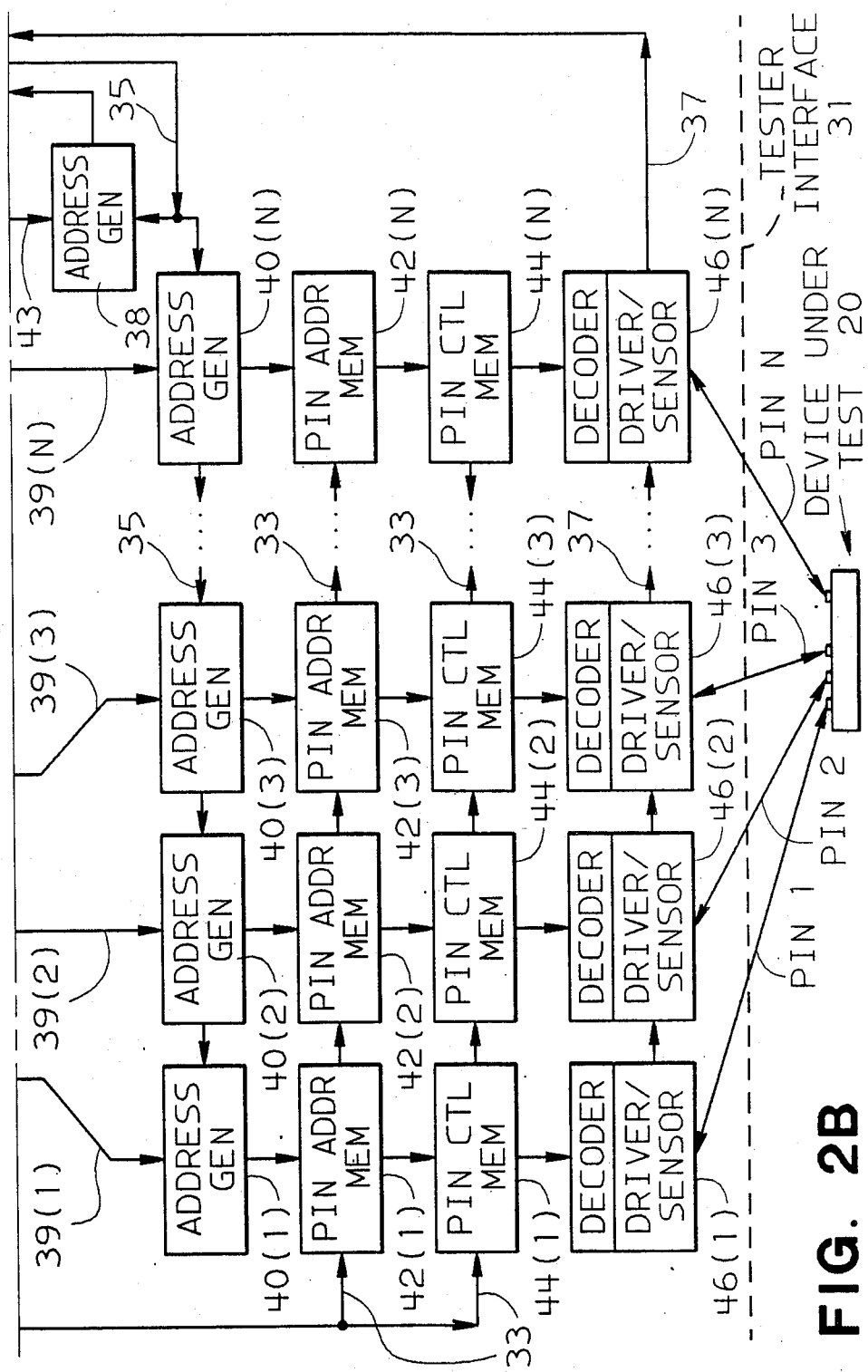

FIG. 2 is a system block diagram of the hierarchical test sequencer invention. FIG. 2 shows a stored program complex logic tester which includes the main processor 30 connected to a bulk store memory 32 and connected by means of the bus 33 to a change control memory 36. The bus 33 also connects to the pin address memories 42(1) to 42(N) and to the pin control memories 44(1) to 44(N). The system of FIG. 2 further includes a test cycle clock 34 which controls the sequence of test cycle intervals and has outputs connected to the main processor 30 and, over line 35, to the address generator 38 and to the address generators 40(1) to 40(N).

The system of FIG. 2 further includes a tester interface schematically shown as the dotted line 31, having a plurality of N contacts which operatively connect respective terminal pins 1 through pin N of a device under test 20 to a respective one of a plurality of N driver/sensor pairs 46(1) through 46(N). Each driver/sensor pair has a decoder with a digital control input and has an output for transmitting the results of the test over line 37 to the main processor 30.

The hierarchical test sequencer further includes the change control memory 36 which has an address input 41 connected to the address generator 38, and a plurality of N control bit outputs 39(1) to 39(N) and it further has a count value output 43. The change control memory 36 functions to store a plurality of M cluster words W(1) through W(M). Each j-th one of the M cluster words includes a plurality of N change control bits b(i,j) and a count value C(j). In this context, i is an integer which goes from 1 to N and j is an integer which goes from 1 to M.

The hierarchical test sequencer of FIG. 2 further includes a first address generator 38 which has an input connected to the count value output 43 of the change control memory 36 and has a second input 35 connected to the test cycle clock 34. The function of the first address generator 38 is to synchronously change the address applied to the address input 41 of the change control memory 36 in response to the count value C(j) which is output on line 43, in order to permit the accessing of cluster words W(j) stored in the change control memory 36. It is an aspect of the invention that the address generator 38 may cause the repeated accessing of the same cluster word W(j) for the magnitude of the value of the count C(j). In addition, the address generator 38 can access a different cluster word W(k) which is either a numerically consecutive cluster word or a non-consecutive cluster word.

The hierarchical test sequencer of FIG. 2 further includes a plurality of N pin address memories 42(1) to 42(N), each corresponding to a respective i-th one of the N change control bit outputs 39(1) to 39(N). Each pin address memory has an address input and a data output and in addition, it is connected to the bus 33 in order to change the contents stored in the pin address memory. Each pin address memory stores a second plurality of instruction address values. For example, an i-th one of the N pin address memories 42(1) to 42(N), will contain a second plurality of instruction address values, that second plurality being the sum of the products of the count value C(j) times the change control bit b(i,j) for all of the values of j from 1 to M, corresponding to that i-th pin address memory.

The hierarchical test sequencer of FIG. 2 further includes a plurality of N second address generators 40(1) to 40(N). Each of the second address generators has an input connected to a respective i-th one of the N control bit outputs 39(1) to 39(N) and each has an input 35 connected to the test cycle clock 34. In addition, each of the second address generators 40(1) to 40(N) has an output connected to the address input of a respective i-th one of the N pin address memories 42(1) to 42(N). The function of the second address generators 40(1) to 40(N) is to change the address input to the respective i-th pin address memory 42(i) in response to a first binary "1" of the i-th change control bit b(i,j) output by the change control memory 36.

The hierarchical test sequencer of FIG. 2 further includes a plurality of N pin control memories 44(1) to 44(N). Each pin control memory has an address input connected to the output of a respective i-th one of the N pin address memories 42(1) to 42(N). Each pin control memory has a data output connected to the input of a decode circuit for a respective i-th one of the N driver/sensor pairs 46(1) to 46(N). The function of the pin control memories is to store plurality of pin function instructions which are accessible by the instruction address values in the corresponding pin address memories 42(1) to 42(N). Each instruction in a pin control memory controls the test function of the respective driver/sensor pair 46(1) to 46(N), during one of the test cycle intervals generated by the test cycle clock 34. The instruction from the pin control memory is decoded by the decode circuits of the driver/sensor pairs 46(1) to 46(N).

Figure 3:
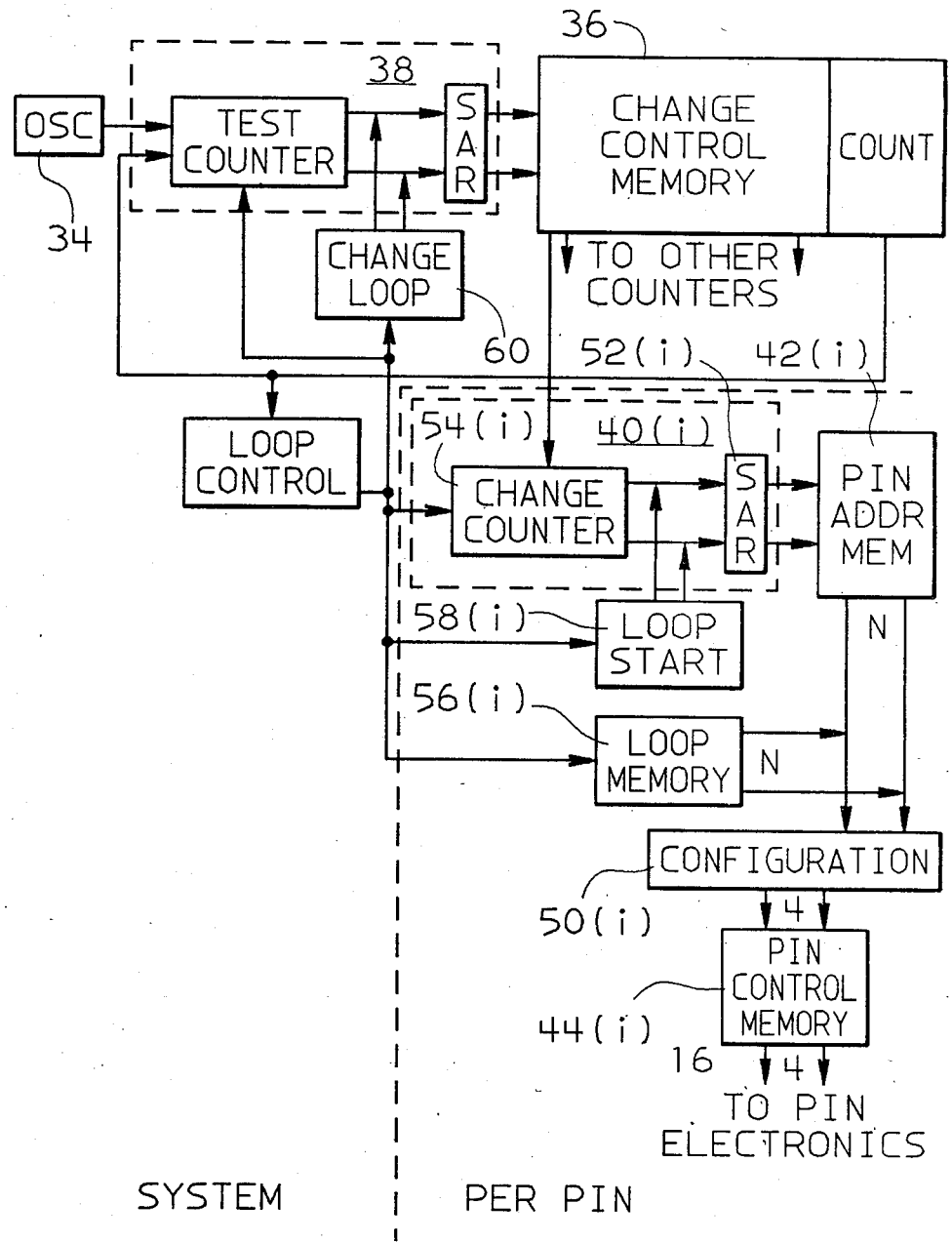
FIG. 3 is a more detailed logic block diagram of the hierarchical tester architecture invention.

Referring now to FIG. 3, it can be seen that each pin control memory 44(i) contains sufficient storage to provide up to 16 unique testing functions. Although this is not a necessary architectural design limit, and its number can be expanded by increasing the memory size, it has been found that this is a sufficient number of testing functions for most product designs. Among the functions performed by a 16 function driver/sensor pair, can be to force a logic one, force a logic zero, force a positive pulse, force a negative pulse, expect a binary one, expect a binary zero, expect a voltage pulse, retrigger, etc.

Further in accordance with the invention, each pin control memory 44(i) is addressed by its corresponding pin address memory 42(i) through its configurator 50(i). The configurator may be programmed to select from one to four bits to be used in addressing the pin control memory 44(i). Functions to be used for a specific pin and part number are stored in the low order addresses of the pin control memory 44(i). Hence, if a given pin of the device 20 requires the use of only two testing functions, then only a single address binary bit need be used for each test vector in order to test that pin. The pin address memory storage address register 52(i) is caused to be changed sequentially by the change counter 54(i), which is caused to increment on a signal from the change control memory 36. A binary one value stored in a specific change control bit of a vector for a specific pin of the device under test, creates the signal for the change counter 54(i). The change control memory 36 is of a size consistent with the tester design. Also contained within the change control memory 36 is the count value field which allows the repeating of a specific change vector any number of times, corresponding to the magnitude of the count value output on line 43 to the address generator 38. As an example, to replicate testing functions for a typical level sensitive scan design testing of a device 20, would require a memory of 120 bits wide by 100 vectors deep (that is 12,000 binary bits). The pin address memory 42(i) would need to contain about 7500 bits of data for each pin of the device under test for a total of 912,000 bits (versus a prior art requirement of nearly 3,000,000 bits). Since no real time algorithms are required when decoding pin data, the pin address memories 42(i) may be constructed of low speed, low cost, high density interleaved memory components.

An additional feature of the invention is the ability to loop on a set of test vectors as may be required for system debug and allow repeated use of cluster words. This is provided by the inclusion of a loop memory 56(i) and a loop start register 58(i). The loop memory 56(i) is caused to replace the pin address memory 42(i) for the first n vectors of a loop while the loop start register 58(i) is reading data from the pin address memory 42(i) consistent with the ending address in the loop memory 56(i). The loop will run the number of vectors in the count field of the change control memory 36 and will start at the address contained in the change loop register 60 until interrupted by the main processor 10 or a count equals zero. Additional functions such as "match mode" and any others known in the art may be implemented with this architecture.

OPERATION OF THE INVENTION

Figure 4:
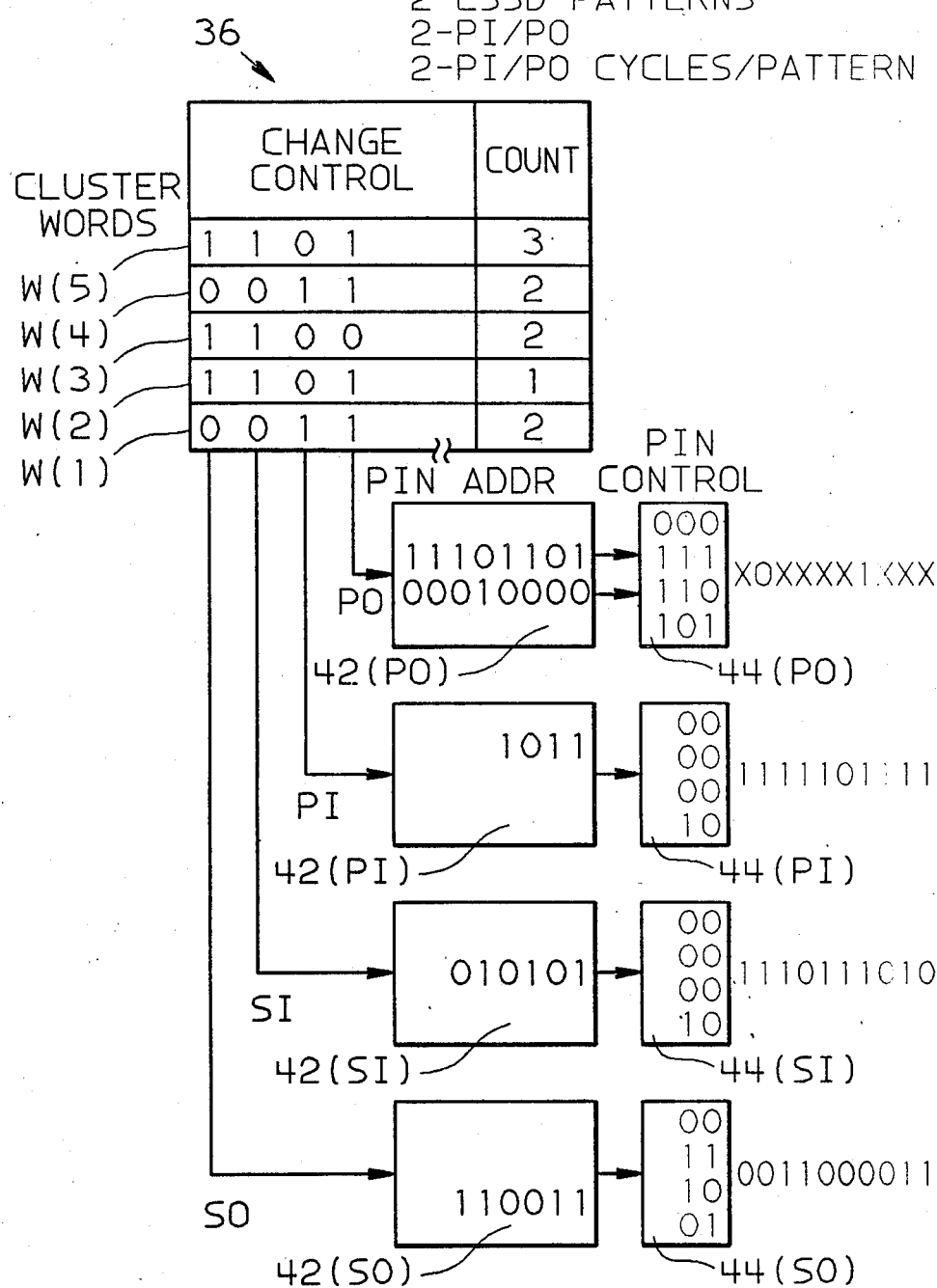
FIG. 4 is a conceptual data flow diagram illustrating the operation of the invention.

The operation of the invention can be more fully appreciated with reference to FIG. 4 which is an example of test data arranged for a simple four terminal level sensitive scan design-type device 20. Level sensitive scan design-type testing is described for example in U.S. Pat. No. 3,783,254 to Eichelberger, entitled "Level Sensitive Logic System" and U.S. Pat. No. 3,761,695 entitled "Method of Level Sensitive Testing a Functional Logic System," both patents being assigned to the IBM Corporation. In FIG. 4, five cluster words W(1) to W(5) are shown in the change control memory 36. The device under test has four pins labeled PO, PI, SI and SO. Pin PO represents a primary output of the device under test 20, which for this example only requires the recognition of three states, the first being "expect 0," the second being "expect 1" and the third being "expect x," which can be an unknown condition, for example. The PI pin is a primary input pin to the device under test, which requires the forcing of two states, the first being "force 0" and the second being "force 1." The SI pin is a level sensitive scan design (LSSD) shift input pin requiring the forcing of two states, the first being a "force 0" and the second being a "force 1." The SO pin is an LSSD shift output pin from the device under test, requiring the recognition of two states, the first being an "expect 0" and the second being an "expect 1."

In operation, the cluster word W(1) in the change control memory 36 will cause the corresponding pin address memories 42(PI) and 42(PO) to each read two cycles, resulting in the pin control memory 44(PO) to output instructions to the pin electronics for the PO pin to "expect x" followed by "expect 0" and will result in the pin address memory 42(PI) to cause the pin control memory 44(PI) to output instructions to the pin electronics for the PI pin to be "force 1" followed by "force 1." During the same two test cycles, the pin address memory 42(SI) and 42(SO) will not be incremented and therefore the pin control memory 44(SI) will output to the pin electronics for the SI pin instructions to "force 1" followed by "force 1" and the pin control memory 44(SO) will output instructions to the pin electronics for the SO pin to "expect 0" followed by "expect 0."

The first cluster word W(1) will remain effective for two cycles, as is specified by the count value of "2" therein. After the first two cycles, the count value will be exhausted, and the address generator 38 will then cause the addressing of the second cluster word W(2). It can be seen from the second cluster word W(2) that the pin address memories 42(PO), 42(SI), and 42(SO) will each be incremented by one since the binary value of the change control bits corresponding to pins PO, SI and SO is equal to one. However, the second cluster word W(2) has the change control bit corresponding to the pin PI equal to zero and therefore the pin address memory 42(PI) will not increment during the third test cycle. The second cluster word W(2) has a count value of one contained therein and therefore the cluster word W(2) will be effective for only a single test cycle, that is the third test cycle in the sequence of this example. After the completion of the third test cycle, the address generator 38 will access the third cluster word W(3).

As can be seen for cluster word W(3) shown in FIG. 4, the pin address memories 42(SI) and 42(SO) are each incremented for two consecutive cycles, whereas the pin address memories 42(PO) and 42(PI) are not incremented for the two cycles, namely the fourth and fifth cycles in the sequence of this example. The third cluster word W(3) has a count value of two, and therefore after the completion of the fifth test cycle in the sequence of this example, the address generator 38 will then access the fourth cluster word "4."

The change control bits in the fourth cluster word W(4) have binary zero values for the change control bits corresponding to the SI pin and the SO pin and they have binary one bit values for the change control bits corresponding to the PO pin and the PI pin. Since the count value is two for the fourth cluster word W(4), the fourth cluster word W(4) will be effective for two consecutive test cycles, namely the sixth and the seventh test cycles in the sequence of this example. During the sixth and seventh test cycles of this example, the pin address memory 42(PO) will be incremented twice and the pin address memory 42(PI) will be incremented twice whereas the pin address memories 42(SI) and 42(SO) will not be incremented.

After the completion of the seventh test cycle in the sequence of this example, the address generator 38 will access the fifth cluster word W(5) shown in FIG. 4. Since the count value is three for the fifth cluster word W(5), this cluster word will be effective for the three consecutive test cycles, namely the eighth, ninth and tenth test cycles in the sequence of this example. During those three test cycles, since the change control bits corresponding to the PO pin, the SI pin and the SO pin are equal to a binary one, the pin address memories 42(PO), 42(SI) and 42(SO) will each be incremented three times whereas, since the binary value for the change control bit corresponding to the PI pin is a binary zero, the pin address memory 42(PI) will not be incremented during these three test cycles.

As has been previously noted, each instruction address stored in a pin address memory has only as many binary bits as are necessary to fully address the number of test functions to be performed for a corresponding pin. For example, since the PO pin in the example of FIG. 4 requires three test functions to be performed during the course of testing, each address stored in the pin address memory 42(PO) contains two binary bits. Those two binary bits could address up to four different functions represented in the pin control memory 44(PO). In contrast, there are only two test functions which need to be performed on the PI pin during the course of testing for the current device under test, and therefore each address stored in the pin address memory 42(PI) need only be one binary bit in length in order to enable fully addressing either the first test function or alternately the second test function to be performed on the PI pin. Thus it is seen that if there are a plurality of F functions to be performed during the course of testing a particular pin and the magnitude of F is less than $2^k$, then there need be no more than k bits used for each address stored in the pin address memory.

As can be seen from the example shown in FIG. 4, the five cluster words stored in the change control memory 36 were able to generate a sequence of test functions equivalent to 10 test vectors employed in a prior art tester.

The resulting hierarchical tester architecture provides for high speed testing because only the data contained in the hierarchical memories need be changed. The resultant tester provides for improved tester throughput while requiring a smaller memory than has been capable by the prior art.

Although a specific embodiment of the invention has been disclosed, it will be understood by those of skill in the art that the foregoing and other changes in form and detail may be made therein without departing from the spirit and the scope of the invention.

What is claimed is:

1. In a stored program complex logic tester, including a test cycle clock for controlling the sequence of test cycle intervals, and a tester interface having a plurality of N contacts which operatively connect respective terminals of a device under test to a respective one of a plurality of N driver/sensor pairs, each driver/sensor pair having a digital control input, a hierarchical test sequencer, comprising:

a change control memory having an address input, a plurality of N control bit outputs and a count value output, for storing a plurality of M cluster words, each j-th one of said M cluster words including a plurality of N change control bits b(i,j) and a count value C(j), (where i is an integer from 1 to N and j is an integer from 1 to M);

a first address generating means having a first input connected to said count value output and a second input connected to said test cycle clock, for synchronously changing the address applied to said address input of said change control memory in response to said count value output, to access said cluster words therein;

a plurality of N pin address memories, each corresponding to a respective i-th one of said N change control bit outputs and each having an address input and a data output, for storing a second plurality of instruction address values in an i-th one of said N pin address memories, said second plurality being the sum of the products of said count value C(j) times said change control bit b(i,j) for all values of j from 1 to M;

a plurality of N second address generating means, each having an input connected to a respective i-th one of said N control bit outputs and an input connected to said test cycle clock, and an output connected to said address input of a respective i-th one of said N pin address memories, for changing the address input to said respective i-th pin address memory in response to a first binary value of an i-th change control bit b(i,j) output by said change control memory;

a plurality of N pin control memories, each having an address input connected to said output of a respective i-th one of said N pin address memories, and a data output connected to said digital control input of a respective i-th one of said N driver/sensor pairs, for storing a plurality of pin function instructions accessible by said instruction address values, each said instruction controlling the test function of said respective driver/sensor pair during one of said test cycle intervals;

whereby an improved complex logic tester is formed.

2. The apparatus of claim 1 which further comprises:
said i-th driver/sensor pair performing a plurality of F test functions, where F is less than $2^k$;
said i-th pin address memory storing an instruction address value composed of a plurality of k binary bits;
whereby test data can be stored in a more compact manner than has been available in the prior art.

3. In a stored program complex logic tester, including a test cycle clock for controlling test cycle intervals, and a tester interface having a plurality of contacts which operatively connect respective terminals of a device under test to a respective one of a plurality of N driver/sensor pairs, each driver/sensor pair having a control input, a hierarchical test sequencer, comprising:
a change control memory having an address input, a plurality of N control bit outputs and a count value output, for storing a plurality of M cluster words, each j-th one of said M cluster words including a plurality of N change control bits b(i,j) and a count value C(j), (where i is an integer from 1 to N and j is an integer from 1 to M);
a first address generating means having a first input connected to said count value output and a second input connected to said test cycle clock, for changing the address applied to said address input of said change control memory in response to said count value output, to access said cluster words therein;
a plurality of N pin address memories, each corresponding to a respective i-th one of said N change control bit outputs and each having an address input and a data output, for storing a second plurality of instruction address values in an i-th one of said N pin address memories;
a plurality of N second address generating means, each having an input connected to a respective i-th one of said N control bit outputs and an input connected to said test cycle clock, and an output connected to said address input of a respective i-th one of said N pin address memories, for changing the address input to said respective i-th pin address memory in response to a first binary value of an i-th change control bit b(i,j) output by said change control memory;
a plurality of N pin control memories, each having an address input connected to said output of a respective i-th one of said N pin address memories, and a data output connected to said control input of a respective i-th one of said N driver/sensor pairs, for storing a plurality of pin function instructions accessible by said instruction address values, said instructions controlling test functions of said respective driver/sensor pair;
whereby an improved complex logic tester is formed.

4. The apparatus of claim 3 which further comprises:
said i-th driver/sensor pair performing a plurality of F test functions, where F is less than $2^k$;
said i-th pin address memory storing an instruction address value composed of a plurality of k binary bits;
whereby test data can be stored in a more compact manner than has been available in the prior art.

* * * * *